(12) United States Patent
Reboh et al.

(10) Patent No.: US 12,438,036 B2
(45) Date of Patent: Oct. 7, 2025

(54) METHOD FOR MANUFACTURING A SOI OR SiGeOI TYPE SEMICONDUCTOR-ON-INSULATOR SUBSTRATE BY BESOI AND STRUCTURE FOR MANUFACTURING SUCH A SUBSTRATE

(71) Applicant: COMMISSARIAT À L'ÉNERGIE ATOMIQUE ET AUX ÉNERGIES ALTERNATIVES, Paris (FR)

(72) Inventors: Shay Reboh, Grenoble (FR); Virginie Loup, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 495 days.

(21) Appl. No.: 17/813,860

(22) Filed: Jul. 20, 2022

(65) Prior Publication Data

US 2023/0025306 A1   Jan. 26, 2023

(30) Foreign Application Priority Data

Jul. 23, 2021   (FR) ...................................... 2107984

(51) Int. Cl.
*H01L 21/762* (2006.01)
*H01L 21/306* (2006.01)

(52) U.S. Cl.
CPC .. *H01L 21/76256* (2013.01); *H01L 21/30604* (2013.01)

(58) Field of Classification Search
CPC ................... H01L 21/76256; H01L 21/30604
See application file for complete search history.

(56) References Cited

U.S. PATENT DOCUMENTS 5,013,681 A     5/1991  Godbey et al.
5,476,813 A  * 12/1995  Naruse .............. H01L 21/76256
                                                                257/586

(Continued)

FOREIGN PATENT DOCUMENTS

WO        0199169 A2    12/2001

OTHER PUBLICATIONS

Search Report for FR2107984 dated Apr. 11, 2022.

(Continued)

*Primary Examiner* — Joseph C. Nicely
(74) *Attorney, Agent, or Firm* — Chrisman Gallo Tochtrop LLC (57) ABSTRACT

A method for manufacturing a semiconductor-on-insulator substrate by BESOI comprising the following steps: a) provide a structure comprising a first substrate, a first stopping layer made of SiGe having an atomic percentage of Ge lower than or equal to 30%, an intermediate layer, a second stopping layer made of SiGe having a thickness smaller than the thickness of the first stopping layer and an atomic percentage of Ge higher than or equal to 20%, optionally an active area formed by a layer made of silicon or by a stack of active layers made of Si and SiGe, a dielectric layer, a second substrate, b) thin and then etch the first substrate made of silicon, from the first main face up to the second main face, c) successively remove the first stopping layer, the intermediate layer, and optionally the second stopping layer to obtain a SOI or SiGeOI substrate.

15 Claims, 4 Drawing Sheets

(56) References Cited

U.S. PATENT DOCUMENTS

| | | | |
|---|---|---|---|
| 5,906,951 A * | 5/1999 | Chu | H01L 21/2007 |
| | | | 438/751 |
| 6,059,895 A | 5/2000 | Chu et al. | |
| 2005/0104067 A1 * | 5/2005 | Chu | H01L 21/76256 |
| | | | 257/66 |
| 2006/0134893 A1 * | 6/2006 | Savage | H10D 62/117 |
| | | | 257/E29.022 |

OTHER PUBLICATIONS

Hartmann, J.M. et al. "Critical thickness for plastic relaxation of SiGe on Si(001) revisited" Journal of Applied Physics, Oct. 31, 2011, vol. 111, 083529 thru 083529-8.

* cited by examiner

METHOD FOR MANUFACTURING A SOI OR SiGeOI TYPE SEMICONDUCTOR-ON-INSULATOR SUBSTRATE BY BESOI AND STRUCTURE FOR MANUFACTURING SUCH A SUBSTRATE

CROSS-REFERENCE TO RELATED APPLICATIONS

This application claims priority from French Patent Application No. 2107984 filed on Jul. 23, 2021. The content of this application is incorporated herein by reference in its entirety.

TECHNICAL FIELD

The present invention relates to the general field of semiconductor-on-insulator substrates for example of the SOI or SiGeOI type.

The invention relates to a method for manufacturing a semiconductor-on-insulator substrate by BESOI.

The invention also relates to a structure for manufacturing a semiconductor-on-insulator substrate by BESOI.

The invention finds applications in many industrial fields, and in particular for 3D integration.

The invention is particularly interesting since it allows manufacturing SOI substrates, and particular FDSOI-type substrates, at low temperature.

PRIOR ART

There are several methods for manufacturing a Silicon-on-Insulator (or SOI) type substrate.

One of the processes consists in implanting hydrogen in a silicon substrate. Afterwards, the substrate is stuck by molecular adhesion over another substrate, and then a heat treatment is carried out at a temperature typically higher than 400° C. to induce a fracture at the area implanted with hydrogen. This fracture causes the separation of the assembly stuck substrates, at the area implanted with hydrogen. Thus, a SOI substrate is obtained. However, such a thermal budget is not compatible with all technologies. In addition, the SOI substrates obtained by a Smart-Cut® type process should then be subjected:

to a step of thinning by thermal oxidation followed by a removal of the oxide and/or to a high-temperature (typically at more than 1,000° C.) process to eliminate the residual surface roughness of the fracturing process, and to a step of annealing at high-temperature (typically at a temperature higher than 900° C.) to eliminate implantation defects.

However, such a thermal budget is not compatible with all technologies.

In order to overcome this drawback, it is possible to manufacture a SOI substrate with a BESOI ("Bonded and Etch back Silicon On Insulator") type process.

Figure 1A:
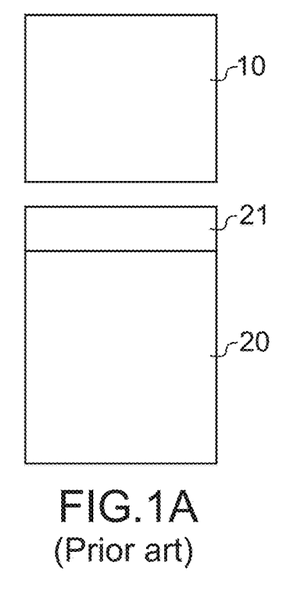
FIGS. 1A and 1B, described before, schematically represent in section different steps of a method for manufacturing a SOI substrate by BESOI according to the prior art.
Figure 1B:
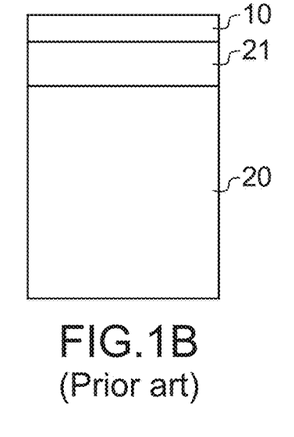

This method consists in sticking two silicon substrates 10, 20: a donor substrate 10 and a handling substrate 20. The handling substrate 20 is covered by an oxide layer 21 (FIG. 1A). Afterwards, the donor substrate 10 is thinned until obtaining a silicon active layer with the desired thickness, typically from 100 nm to a few micrometres (FIG. 1B). Alternatively, it is possible to have the oxide layer over the donor substrate 10 or over both the donor substrate 10 and the handling substrate 20. One amongst the primary advantages of this technology is the implementation of sticking with a low thermal budget: sticking at 300° C. could be enough to obtain the required properties.

However, one amongst the current issues is to obtain SOI substrates having a very thin silicon active layer, in particular in the range of ten nanometres and optionally less and with a very low variability of this thickness over the wafer, typically lower than 10% of the thickness of the active layer.

Figure 2:
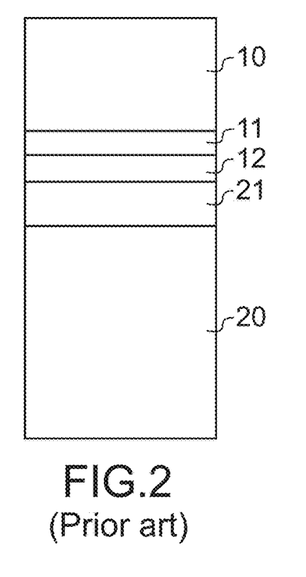
FIG. 2, described before, schematically represents in section, a structure for obtaining a SOI substrate by BESOI, the structure including a stopping layer, according to the prior art.

In order to accurately determine the end of the thinning step of a BESOI process, it is possible to use a stopping layer 11 (FIG. 2). The stopping layer 11 and then the silicon active layer with the desired thickness are formed over the handling substrate 10. Afterwards, the two substrates 10, 20 are fastened to each other. The substrate 10 is thinned up to the stopping layer 11 and ten this stopping layer 11 is eliminated. A SOI substrate is then obtained with a thin active layer.

For example, the document U.S. Pat. No. 5,013,681 describes a method for manufacturing a SOI substrate by BESOI with one or two stopping layer(s). One of the stopping layers may be made of SiGe. For example, the method with one stopping layer includes the following steps:

form a stopping layer made of a silicon and germanium alloy, for example by chemical vapour deposition (CVD) or molecular-beam epitaxy (MBE) at a temperature from 400° C. to 900° C., over a first silicon substrate, the stopping layer having a thickness comprised between 10 nm and 500 nm, form a silicon layer having a thickness comprised between 20 nm and 1 µm, over the stopping layer at a temperature from 400° C. to 900° C., then oxidise it to obtain an oxide layer at the surface, stick the stack thus obtained over a second silicon substrate covered with an oxide layer, the annealing temperature being comprised between 700° C. and 1,000° C., polish, for example by CMP, the first stack, up to the stopping layer, and then remove the stopping layer for example by etching.

However, this document says nothing about the manner for selecting the thickness of the layers.

Figure 3A:
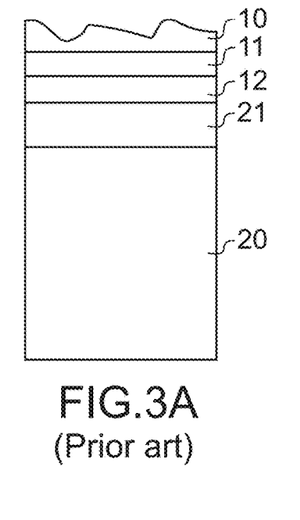
FIGS. 3A and 3B, described before, schematically represent in section, thickness variations after thinning of a substrate made of silicon in a structure comprising a stopping layer, according to the prior art.

Yet, the step of thinning the donor substrate is generally carried out by mechanical lapping ('grinding') in order to quickly remove a large amount of material off the donor substrate 10 and thus quickly obtain reasonable thicknesses for the remainder of the process. This step leads to local thickness variations (FIG. 3A). This inhomogeneity may be characterised by the total thickness variation (referred to later on by TTV). It may be schematically represented by a slope (like in FIG. 3B). In addition, even though later on, the material removal is carried out by chemical etching and/or by chemical-mechanical polishing (CMP), the TTV could be slightly reduced but these inhomogeneities persist.

Figure 3B:
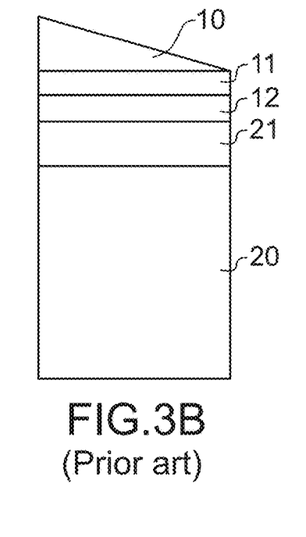

Thus, when the stopping layer is reached at the thinning step, we define the thickness variation due to thinning/etching of the silicon by TTV landing. The function of the stopping layer is to reduce this landing thickness variation. An ideally perfect stopping layer will reduce the landing TTV to zero. Nevertheless, in most of these practical cases, a thickness variation is transferred to the stopping layer and defined as TTV transferred. Hence, the stopping layer 11 should have a minimum thickness preferably at least equal to the TTV transferred so that the thickness variation due to etching of the silicon substrate 10 is 'absorbed' in the stopping layer 11 and does not propagate to the active underlayer 12 made of silicon (FIGS. 3A and 3B).

With most recent thinning ('grinding') machines, the material removal could be quite homogeneous and the TTV is quite low (typically smaller than or equal to 1,000 nm for example in the range of 500 nm). One single stopping layer could be enough to manufacture a SOI substrate by BESOI with low thicknesses and thickness variations of the transferred layer.

But for many machines, in particular for less expensive machines and/or for old generation machines, the first thinning step could lead to high TTVs (typically larger than or equal to 2,000 nm and optionally larger than or equal to 2,500 nm). One single stopping layer is then no longer enough. It is then necessary to have a structure with several stopping layers.

However, the selection of the nature and of the thickness of these stopping layers is not straightforward because many parameters should be taken into account such as the plastic relief critical thickness of the stopping layers and the total thickness of the structure that should remain in a pseudomorphic state.

DISCLOSURE OF THE INVENTION

The present invention aims to provide a method for manufacturing a semiconductor-on-insulator substrate, for example Silicon-on-insulator (SOI) or SiGe-on-insulator (SiGeOI), by BESOI overcoming at least part of the drawbacks of the prior art, able to be implemented in many thinning machines, even the less effective ones (able to lead to TTV larger than or equal to 2,000 nm and optionally larger than or equal to 2,500 nm), and allowing manufacturing a SOI substrate having upon completion of the method a good quality active silicon layer.

For this purpose, the present invention provides a method for manufacturing a semiconductor-on-insulator substrate, in particular a silicon-on-insulator or SiGe-on-insulator type substrate, by BESOI comprising the following steps:
provide a structure successively comprising:
 a first substrate made of silicon, comprising a first main face and a second main face,
 a first stopping layer made of SiGe having a first thickness and an atomic percentage of Ge lower than or equal to 30%, and preferably comprised between 10% and 30% and even more preferably between 15% and 30%, the first stopping layer being in contact with the second main face of the first substrate,
 an intermediate layer made of silicon or of SiGe, the atomic percentage of Ge of the intermediate layer being lower by at least 10%, and optionally by at least 15%, than the atomic percentage of Ge of the first stopping layer,
 a second stopping layer made of SiGe having a second thickness smaller than the first thickness of the first layer and an atomic percentage of Ge higher than or equal to 20%, the atomic percentage of Ge of the intermediate layer being lower by at least 10%, and optionally by at least 15%, than the atomic percentage of Ge of the second stopping layer,
 optionally, an active area formed by an active layer made of silicon or by a stack of active layers comprising at least one layer made of silicon and at least one layer made of SiGe preferably having an atomic percentage of Ge comprised between 20% and 35%,
 a dielectric layer for example made of silicon oxide or of silicon nitride,
 a second substrate for example made of silicon,
b) thin the first substrate made of silicon, from the first main face, so as to remove a first portion of the first substrate and leave a second portion of the substrate, the second portion having, for example, a thickness smaller than or equal to 50 µm, for example between 30 and 50 µm, preferably smaller than or equal to 30 µm, for example between 20 and 30 µm, even more preferably smaller than or equal to 20 µm, for example between 10 and 20 µm, even more preferably smaller than or equal to 10 µm, for example between 2.5 and 10 µm, the thinning step b) could lead to a total thickness variation of the thinned first substrate larger than or equal to 2,000 nm, and preferably larger than or equal to 2,500 nm,
c) successively remove:
the second portion of the first substrate, for example, by chemical etching, up to the second main face of the first substrate, so as to reach the first stopping layer,
the first stopping layer, for example by chemical etching,
the intermediate layer, for example by chemical etching,
optionally, the second stopping layer, for example by chemical etching, subject to which a semiconductor-on-insulator substrate is obtained comprising a substrate covered by a dielectric layer and an active area or a substrate covered by a dielectric layer and the second stopping layer made of SiGe.

The invention essentially differs from the prior art by the use of a structure comprising two stopping layers made of SiGe. These stopping layers have particular thicknesses and germanium concentrations. With such a structure, upon completion of the BESOI process, a semiconductor-on-insulator substrate, for example SOI or SiGeOI, with a very good quality is obtained. In particular, the SOI substrate has a silicon active layer having a very low total thickness variation (TTV) induced by the process able to fall down to the subnanometric scale. Thus, the active layer may be very thin (typically with a thickness smaller than or equal to 10 nm).

Such a structure is particularly interesting for advanced BESOI manufacturing implementing steps of thinning with thinning machines that are less effective and/or less expensive than those of the last generations. Indeed, this structure allows compensating for TTVs of 2,000 nm or more, and optionally of 2,500 nm or more.

Advantageously, the first stopping layer has an atomic percentage of Ge lower than or equal to 25%, and preferably higher than or equal to 20%.

Advantageously, the second stopping layer has an atomic percentage of Ge higher than or equal to 20%, and preferably lower than or equal to 40%.

The first stopping layer and the second stopping layer may have identical or different Ge concentrations. For example, the two stopping layers may have a Ge concentration of 20%.

Advantageously, the second thickness is at least twice as small as the first thickness. For example, the second thickness is from 5 to 10 times as small as the first thickness. Even more advantageously, the second thickness is at least 10 times as small as the first thickness.

Preferably, the second thickness is smaller than or equal to 20 nm.

For example, the first stopping layer has a thickness smaller than 200 nm. Advantageously, the first stopping layer has a thickness between 50 nm and 150 nm, for example 70-80 nm, and an atomic concentration of Ge of 25%.

Advantageously, the second stopping layer has a thickness smaller than or equal to 20 nm (below the critical thickness). Preferably, it has a thickness between 8 nm and 20 nm, for example 10 nm, and an atomic concentration of Ge from 30 to 40%, for example 40%. The second stopping layer, having a higher Ge concentration, may be very thin. The use of stopping layers with small thicknesses is advantageous from an economical perspective but also to reduce the degradation of the TTV imparted by the epitaxy process and to minimise the risk of forming dislocations (critical thickness).

Advantageously, the intermediate layer and/or the active layer made of silicon have a thickness between 5 nm and 100 nm, preferably from 10 to 20 nm, for example 10 nm.

The thickness of the intermediate layer made of silicon is selected so as to obtain a structure having a thickness smaller than the critical thickness of the structure to keep the multilayer in a pseudomorphic state. The selection of a small thickness is also advantageous to minimise the production cost. It is also advantageous to reduce the thickness of the epitaxial layer to reduce the TTV. On the other hand, an intermediate layer with a larger thickness allows compensating for the stress of the SiGe layer.

Advantageously, the structure provided at step a) is obtained according to the following steps:
provide a first stack comprising:
a first silicon substrate,
a first stopping layer made of SiGe having a first thickness and an atomic percentage of Ge lower than or equal to 30%, and preferably comprised between 10% and 30% and even more preferably between 15% and 30%,
an intermediate layer made of silicon or of SiGe, the atomic percentage of Ge of the intermediate layer being lower by at least 10%, and optionally at least 15%, than the atomic percentage of Ge of the first stopping layer,
a second stopping layer made of SiGe having a second thickness smaller than the first thickness of the first layer and an atomic percentage of Ge higher than or equal to 20%, the atomic percentage of Ge of the intermediate layer being lower by at least 10% than the atomic percentage of Ge of the second stopping layer,
optionally, an active area formed by an active layer made of silicon or by a stack of active layers comprising at least one layer made of silicon and at least one layer made of SiGe preferably having an atomic percentage of Ge comprised between 20% and 35%,
ii) provide a second stack comprising a second substrate, for example made of silicon, covered by a dielectric layer for example made of silicon oxide,
iii) fasten the first stack over the second stack, so as to have the dielectric layer in contact with the second stopping layer or with the active area, where appropriate.

In particular, the method for manufacturing the structure may be carried out at low temperature (typically lower than 500° C. and preferably lower than or equal to 300° C., and even lower than or equal to 200° C.).

The method has many advantages:
not using boron for the stopping layer, which avoids contaminating the silicon,
manufacturing SOI substrates ('wafer SOI') with a low thermal budget (with bonding at 200° C., a bonding of 4 J/mm² is obtained for a Si/SiO₂ interface) and that being so without having the drawbacks related to ion implantation, for example the presence of defects in the transferred layers,
being able to manufacture a SOI substrate having a thin active layer compatible with the specifications of a FDSOI ('Fully Depleted Silicon on Insulator') technology, conventionally obtained by a Smart-Cut® type process,
enabling integration on a substrate containing circuits sensitive to high temperatures.

The invention also relates to a structure for manufacturing a silicon-on-insulator semiconductor substrate comprising:
a first silicon substrate,
a first stopping layer made of SiGe having a first thickness and an atomic percentage of Ge lower than or equal to 30%, preferably comprised between 10% and 30% and even more preferably between 15% and 30%,
an intermediate layer made of silicon or of SiGe, the atomic percentage of Ge of the intermediate layer being lower by at least 10%, and optionally by at least 15%, than the atomic percentage of Ge of the first stopping layer,
a second stopping layer made of SiGe having a second thickness smaller than the first thickness of the first layer and an atomic percentage of Ge higher than or equal to 20%, the atomic percentage of Ge of the intermediate layer being lower by at least 10%, and optionally by at least 15%, than the atomic percentage of Ge of the second stopping layer,
optionally, an active area formed by an active layer made of silicon or by a stack of active layers comprising at least one layer made of silicon and at least one layer made of SiGe preferably having an atomic percentage of Ge comprised between 20% and 35%,
a dielectric layer for example made of silicon oxide,
a second substrate for example made of silicon.

Preferably, the second thickness is smaller than or equal to 20 nm.

Such a structure is pseudomorphic.

Advantageously, the structure comprises:
a first silicon substrate,
a first stopping layer made of SiGe having a thickness between 50 nm and 150 nm and an atomic concentration of Ge from 20% to 25%,
an intermediate layer made of silicon,
a second stopping layer made of SiGe having a thickness between 8 nm and 20 nm, for example 10 nm, and an atomic concentration of Ge from 20% to 40%,
an active layer made of silicon,
a silicon oxide layer,
a second silicon substrate.

Other features and advantages of the invention will arise from the following complementary description.

It goes without saying that this complementary description is provided to illustrate the object of the invention and should in any case be considered as a limitation of this object.

BRIEF DESCRIPTION OF THE DRAWINGS

The present invention will be better understood upon reading the description of embodiments provided for merely indicative and non-limiting purposes with reference to the appended drawings wherein.

The different portions represented in the figures are not necessarily according to a uniform scale, to make the figures more readable.

The different possibilities (variants and embodiments) should be understood as non-exclusive of one another and could be combined together.

Furthermore, in the description hereinafter, terms that depend on the orientation, such as "top", "bottom", etc., of a structure apply while considering that the structure is oriented as illustrated in the figures.

DETAILED DISCLOSURE OF PARTICULAR EMBODIMENTS

Figure 4A:
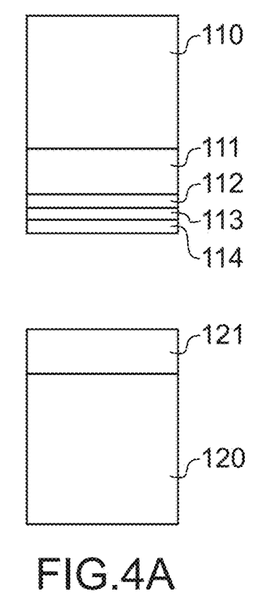
FIGS. 4A to 4G schematically represent in section different steps of a method for manufacturing a SOI substrate by BESOI according to a particular embodiment of the invention.
Figure 4B:
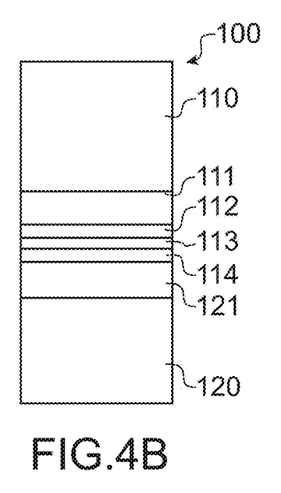
Figure 4C:
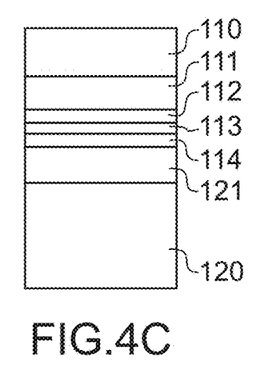
Figure 4D:
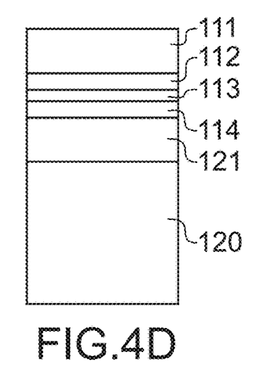
Figure 4E:
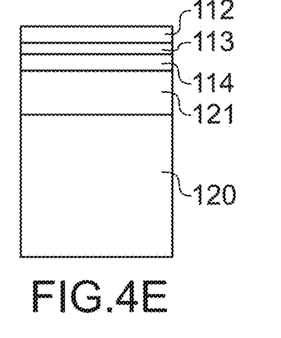
Figure 4F:
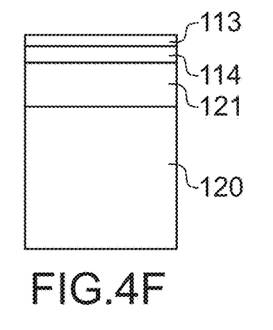
Figure 4G:
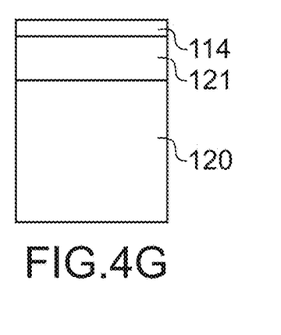

First of all, reference is made to FIGS. 4A to 4G which represent different steps of a method for manufacturing a SOI substrate by BESOI. The method comprises the following steps:
provide a multilayer structure 100 to be thinned, obtained for example, according to the following substeps i), ii) and iii):
provide a first stack successively comprising:
a first substrate made of silicon 110 (called donor substrate) comprising a first main face and a second main face,
a first stopping layer 111 made of SiGe having a first thickness and an atomic percentage of Ge lower than or equal to 30%, preferably comprised between 10% and 30% and even more preferably between 15% and 30%,
an intermediate layer 112 made of silicon or of SiGe,
a second stopping layer 113 made of SiGe having a second thickness smaller than the first thickness and an atomic percentage of Ge higher than or equal to 20%,
optionally, an active area formed by an active layer 114 made of silicon (FIG. 4A) or by a stack of active layers formed by at least one layer made of silicon and at least one layer made of SiGe preferably having an atomic percentage of Ge between 20% and 35%,
ii) provide a second stack comprising a second substrate for example made of silicon 120 (called handling substrate) covered by a dielectric layer 121 for example made of silicon oxide or of silicon nitride (FIG. 4A),
iii) fasten the first stack over the second stack, the dielectric layer 121 being in contact with the active area or with the second stop layer 113 (FIG. 4B), b) progressively thin the first substrate 110 made of silicon, from the first main face of this substrate, so as to remove a first portion of the first substrate 110 and leave a second portion of the substrate 110, the second portion having, for example, a thickness smaller than between 30 and 50 µm, preferably between 20 and 30 µm, even more preferably between 10 and 20 µm, even more preferably between 2.5 and 10 µm, the thinning step could lead to a total thickness variation larger than or equal to 2,000 nm, and preferably larger than or equal to 2,500 nm,
(FIG. 4C),
c) successively remove:
the second portion of the first substrate 110, for example, by chemical etching, up to the second main face of the first substrate 110, so as to reach the first stopping layer 111 (FIG. 4D),
the first stopping layer 111 (FIG. 4E),
the intermediate layer 112 (FIG. 4F),
optionally, the second stopping layer 113, subject to which a semiconductor-on-insulator substrate is obtained comprising a substrate 120 covered by a dielectric layer 121 and an active area or a substrate 120 covered by a dielectric layer 121 and the second stopping layer made of SiGe 113 (FIG. 4G).

In the case where the second stopping layer 113 is removed and the first stack comprises an active area, in particular an active layer made of silicon 114, a SOI-type substrate is obtained.

In the case where the second stopping layer 113 is not removed and the first stack does not comprise any active area, a SiGeOI-type substrate is obtained. The second stopping layer 113 then also serves as an active layer.

The first stack provided at step i) comprises a first substrate 110, two etch stopping layers 111, 113 (ESL), an intermediate layer 112 and optionally an active area.

The first substrate 110 comprises two main faces: a first main face and a second main face.

The first stopping layer 111 is in contact with the second main face of the first substrate 110.

The first stopping layer 111 has a thickness allowing absorbing the thickness variation resulting from the step of thinning and/or the step of etching the first substrate 110.

The second stopping layer 113 has a thickness allowing absorbing the thickness variation resulting from etching of the intermediate layer 112.

Advantageously, these thicknesses are compatible with the plastic relief critical thickness in order to avoid the formation of dislocations. In general, the smallest possible thickness will be selected to minimise the degradation of the TTV due to epitaxy and/or to the etching step. The thicknesses of the layers of the first stack also depend on selectivities upon etching. The higher a selectivity, the smaller the thickness of the stopping layer could be.

Preferably, the second thickness is at least twice as small as the first thickness, and even more preferably, the second thickness is at least 10 times as small as the first thickness.

Preferably, the first stopping layer 111 has an atomic percentage of Ge higher than or equal to 20% and/or lower than or equal to 25%.

Preferably, the second stopping layer 113 has an atomic percentage of Ge higher than or equal to 20% and/or lower than or equal to 40%.

For example, the first stopping layer 111 has a thickness between 50 nm and 150 nm and an atomic concentration of Ge of 25%.

For example, the second stopping layer 113 has a thickness between 5 nm and 20 nm, for example 10 nm, and an atomic concentration of Ge of 40%.

Advantageously, the thicknesses of the first stopping layer 111 and of the second stopping layer 113 meet the criterion of the plastic relief critical thickness detailed, for example, in the article of Hartmann et al. (J. Appl. Phys. 110, 083529 (2011)).

The intermediate layer 112 allows absorbing the thickness variation. The intermediate layer is made of Si or of SiGe. The atomic percentage of Ge of the intermediate layer is lower by at least 10% and optionally by at least 15% than the atomic percentage of Ge of the first stopping layer.

The atomic percentage of Ge of the intermediate layer being lower by at least 10% and optionally by at least 15% than the atomic percentage of Ge of the second stopping layer.

Such percentages allow having a good selectivity between the intermediate layer and the stopping layers.

When etching the upper layer, the stopping layers are not or are barely etched which allows stopping etching thanks to a difference in etching selectivity.

The active area may be formed by an active layer made of silicon 114 or by a so-called active stack of active layers. The stack of active layers comprises at least one layer made of silicon and at least one layer made of SiGe. In particular, the stack comprises at least two layers. It may comprise more than 2 layers, for example from 3 to 21 layers. The stack is formed by an alternation of layers made of Si and of layers made of SiGe. For example, it may contain 10 layers made of Si.

The atomic percentage of the SiGe layer(s) of the stack is comprised between 20% and 35%, preferably between 20% and 30%.

Preferably, the intermediate layer 112 and/or the active layer 114 made of silicon have a thickness between 5 nm and 30 nm, for example 10-20 nm.

To obtain this first stack provided at step i), the first stopping layer made of SiGe 111, the intermediate layer 112, the second stopping layer 113 made of SiGe and finally the active area are formed over the first silicon substrate 110. Preferably, these layers are formed by epitaxy.

The second stack provided at step ii) comprises a dielectric layer 121, in particular an oxide layer which could be formed over the second substrate 120 by thermal oxidation. The dielectric layer 121 may have a thickness from 10 to 1,000 nm. The dielectric layer 121 serves as a bonding layer.

Alternatively, the first stack comprises a dielectric layer. According to another alternative, the first stack comprises a first dielectric layer and the second stack comprises a second dielectric layer.

The two stacks are fastened to each other (step iii), preferably by molecular bonding. Upon completion of step iii), the second stopping layer 113 is positioned between the dielectric layer 121 and the intermediate layer 112.

The structure thus obtained successively comprises:
a first silicon substrate 110,
a first stopping layer 111 made of SiGe having a first thickness and an atomic percentage of Ge lower than or equal to 30%, preferably comprised between 10% and 30%, and even more preferably between 15% and 30%, the thickness of the first layer advantageously meeting the critical thickness criterion,
an intermediate layer 112,
a second stopping layer 113 made of SiGe having a second thickness smaller than the first thickness of the first layer,
optionally, an active area for example an active layer made of silicon 114,
a dielectric layer 121,
a second substrate for example made of silicon 120.

Preferably, the second thickness is smaller than or equal to 20 nm.

The layers grow with the mesh parameter of the underlying structure. The thicknesses of the layers (etching stopping layers and intermediate layer) are selected so as to keep the structure in a pseudomorphic state.

For illustration and without limitation, according to one variant, the structure may comprise:
a first silicon substrate 110,
a 80 nm first stopping layer 111 made of SiGe having an atomic percentage of Ge of 25%,
a 10 nm intermediate layer made of silicon 112,
a 10 nm second stopping layer made of SiGe 113 having an atomic percentage of Ge of 40%,
a 10 nm active layer made of silicon 114,
a 145 nm silicon oxide layer 121,
a second silicon substrate 120.

According to another variant, the structure may comprise:
a first silicon substrate 110,
a first stopping layer 111 made of SiGe having a thickness between 200 and 240 nm and an atomic percentage of Ge of 20%,
a 15 to 30 nm intermediate layer 112 made of silicon,
a second stopping layer 113 made of SiGe having a thickness between 10 nm and 20 nm, and an atomic percentage of Ge of 30%,
a 5 to 50 nm active layer made of silicon 114,
a silicon oxide layer 121,
a second silicon substrate 120.

Such structures are stable. The thickness of a multilayer structure is defined by:

$$ESS^{thickness} = \sum_i^n t_i \quad \text{[Math 1]}$$

with $t_i$ the thickness of a layer i.

Advantageously, this thickness is smaller than the critical thickness of the multilayer structure given in the article Hartmann et al. described before.

The critical thickness depends in particular on the average concentration of germanium of the stopping layers defined by:

$$Aver^{concGe} = \frac{\sum_i^n x_i * t_i}{\sum_i^n t_i}$$

With $x_i$ the germanium concentration of the stopping layer i, $t_i$ the thickness of the stopping layer i, i an integer (in the case of two stopping layers i is equal to 1 or 2).

At step b), the first substrate 110 is thinned. At least one first portion of the first substrate is removed off the first main face.

Preferably, the first substrate 110 is thinned at least partially, and optionally completely, by thinning by mechanical lapping also called grinding. This step leads to a high variation of the total thickness of the thinned substrate.

Advantageously, the removal of the first substrate 110 takes place in two steps.

In a first substep, a thinning by mechanical lapping is carried out to quickly remove a first portion of the first substrate 110 from the first main face. Typically, a thickness of a few hundred or tens micrometres is removed, up to a thickness typically smaller than 30 or 50 µm, or smaller than 20 or 30 µm and even smaller than 10 µm. It is possible to remove a first portion so as to have a second portion whose thickness is smaller than 5 µm. After thinning by mechanical lapping, the total thickness variation (TTV) at the surface of the thinned first substrate may be larger than or equal to 2,000 nm or larger than or equal to 2,500 nm. It may also be smaller, for example the total thickness variation (TTV) at the surface of the thinned first substrate may amount to 500 nm.

Then, in a second substep, a Chemical Mechanical Polishing (CMP) and/or (wet and/or dry) chemical etching is carried out, allowing removing the second portion of the first substrate 110 more finely up to the second main face of the first substrate 110 (step c).

Advantageously, the second substep allows obtaining a defect-free, and in particular scratch-free, surface.

Upon completion of the second substep, the TTV remains larger than or equal to 2,000 nm and optionally larger than or equal to 2,500 nm.

Upon completion of step b), the first substrate 110 has been thinned up to the second main one.

TTV landing refers to the thickness variation when the second main face of the first substrate 110 in contact with the first stopping layer 111 is reached. This thickness variation is at least partially transferred to the first stopping layer. TTV transferred refers to the total thickness variation transferred to the first stopping layer.

Figure 5:
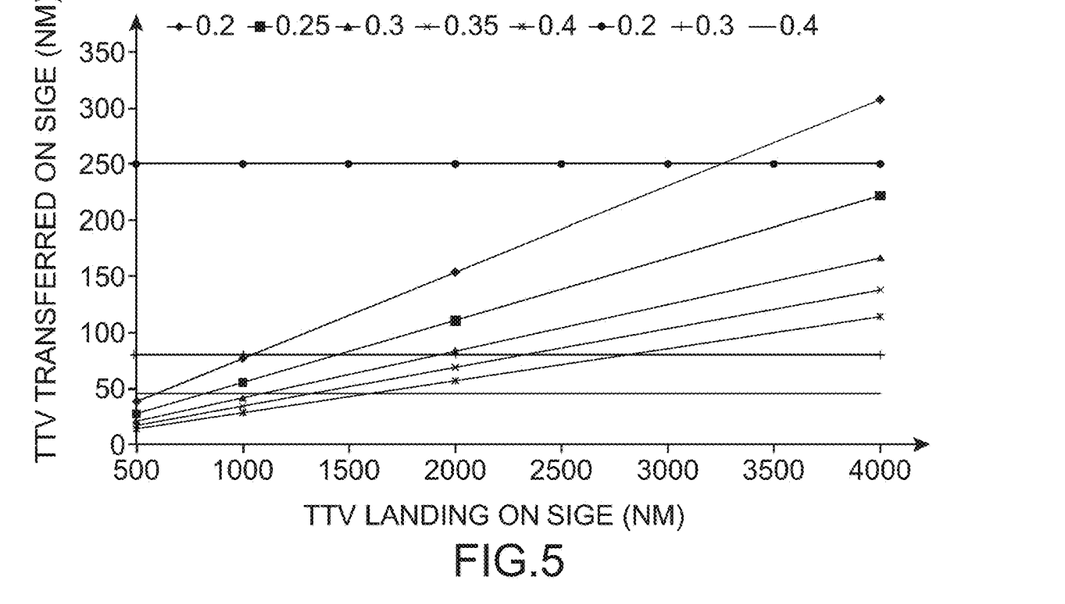
FIG. 5 is a graph representing the TTV transferred as a function of the TTV landing for stopping layers made of SiGe of with different concentrations, the horizontal lines represent the critical thicknesses of stopping layers made of SiGe at 20, 30 and 40%.

FIG. 5 represents the TTV transferred to a stopping layer made of SiGe after the removal of a silicon layer, with a TEAH solution, for different TTV landings. This graph also represents the critical thicknesses tc for SiGe layers having concentrations of 20%, 30% and 40%. This figure allows determining the minimum thickness of a SiGe layer to completely eliminate the silicon by etching and stop etching inside the SiGe layer, without completely removing it (in other words without reaching the underlayer).

The values of the critical thicknesses are derived from the article of Hartmann et al. mentioned before.

For example, FIG. 5 shows that a Si layer with a TTV landing of 3,500 nm could be etched using a 20% pseudomorphic SiGe layer of 240 nm. For a TTV landing of 2,000 nm, a SiGe layer at 30% and even at 35% could be used. However, the critical thicknesses of these layers are not compatible with the concentration necessary for absorbing the TTV landings.

Figure 6:
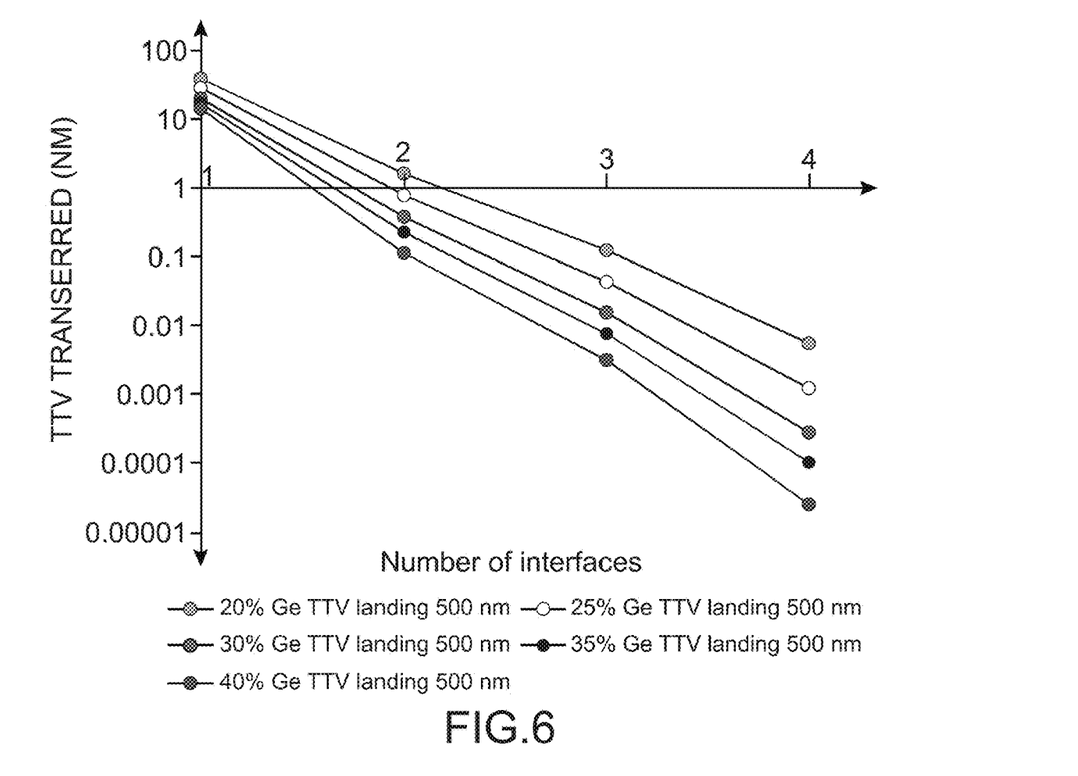
FIG. 6 is a graph representing the TTV transferred at the interfaces of a structure with two stopping layers made of SiGe, for different concentrations of Ge, and for a TTV landing of 500 nm.

FIG. 6 represents the transferred thickness variation as a function of the interfaces of a structure obtained according to a typical removal sequence Si/interface 1/SiGe/interface 2/Si/interface 3/SiGe/interface 4/Si with a low TTV landing, herein 500 nm. To obtain a subnanometric TTV transferred (i.e. having a value smaller than 1 nm), a stopping layer made of SiGe having an atomic concentration of at least 25% is enough.

Figure 7:
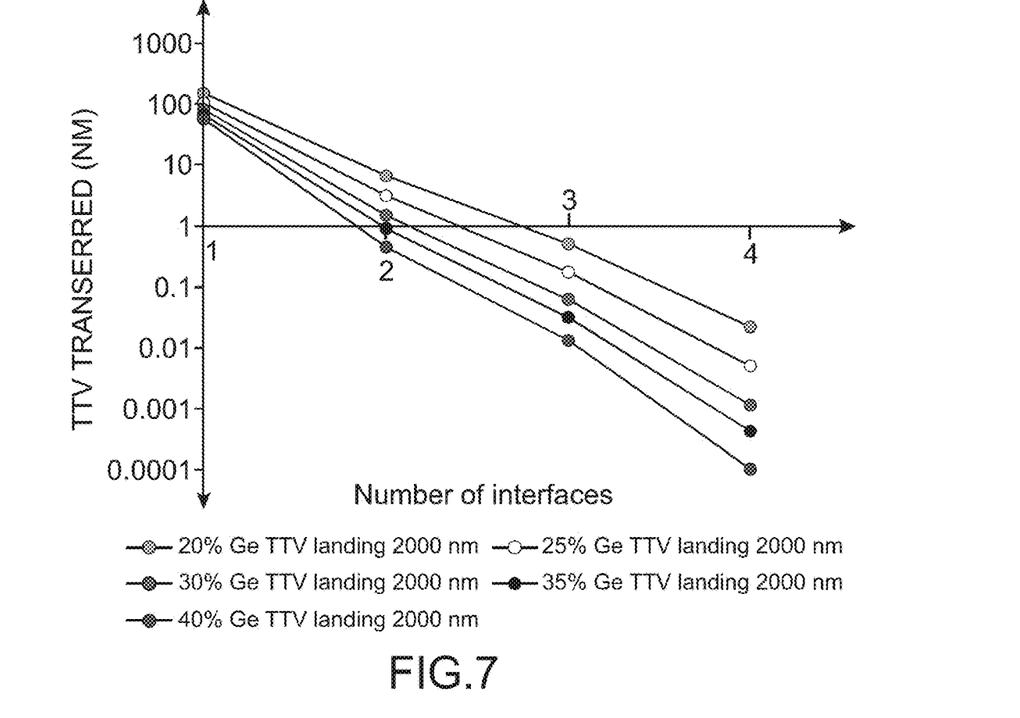
FIG. 7 is a graph representing the TTV transferred at the interfaces of a structure with two stopping layers made of SiGe, for different concentrations of Ge, and for a TTV landing of 2,000 nm.

FIG. 7 represents this time the transferred total thickness variation as a function of the interfaces (the same interfaces as for FIG. 6) with a high TTV landing, herein 2,000 nm. It is tempting to select a first stopping layer with concentrations of 30% or 35%, but their thicknesses would not be compatible with the critical thicknesses (FIG. 5). Hence, several stopping layers are necessary to be able to obtain a subnanometric TTV for the active layer.

Figure 8:
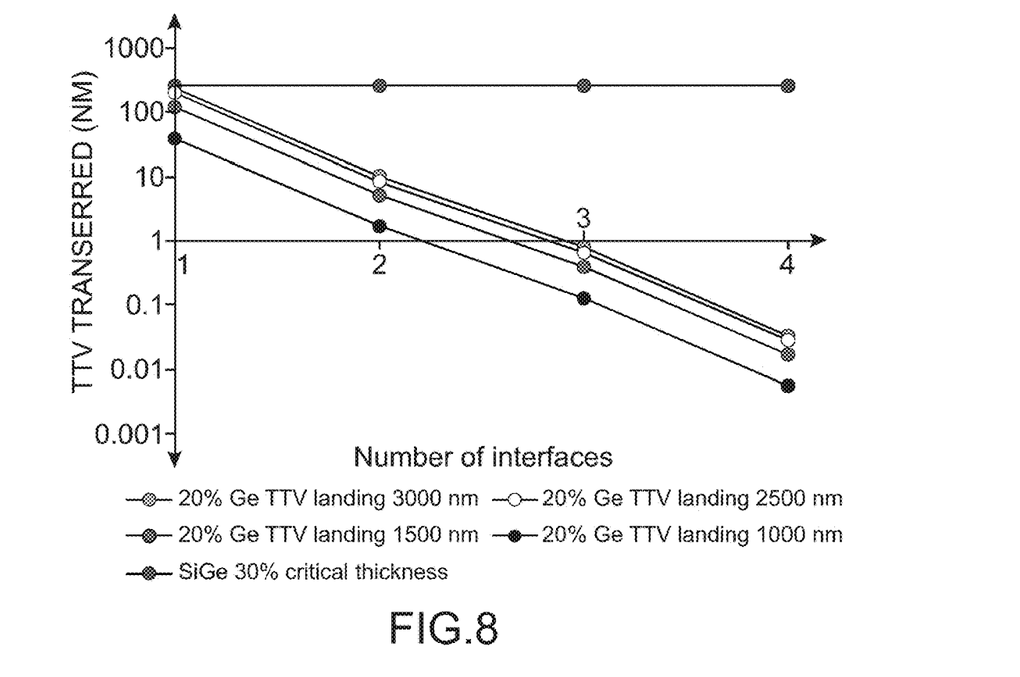
FIG. 8 is a graph representing the TTV transferred at the interfaces of a structure with two stopping layers made of SiGe, for different TTV landing, and for a concentration of Ge of 20%.

FIG. 8 represents the evolution of the TTV transferred with stopping layers made of SiGe at 20% for different TTV landing (from 1,000 nm to 3,000 nm) with the same interfaces as for FIG. 6. It clearly arises from this figure that with a TTV landing of 3,000 nm, one single stopping layer leads to a TTV in the range of 10 nm which is unacceptable in the case of advanced microelectronic applications. Yet, with two stopping layers made of SiGe at 20%, a TTV imparted by the thinning process smaller than 1 nm is obtained when arriving on the active layer.

After step c), the other layers of the first stack are successively removed until obtaining a SOI- or SiGeOI-type substrate (step c):

the first stopping layer 111, through a selective etching with stoppage on the intermediate layer, the intermediate layer 112, through a selective etching with stoppage on the second stopping layer, and optionally the second stopping layer 113 through a selective etching with stoppage on the active area when this is present.

The intermediate layer 112 (disposed between the two stopping layers 111 and 113) is completely suppressed so that, upon completion of step c), a non-processed substrate (SOI or SiGeOI) substrate is obtained in which components could be made.

At steps b) and c), each of the elements (layer or substrate) to be etched advantageously have an etching selectivity with respect to the underlayer.

The first substrate 110 may have an etching selectivity with respect to the stop layer 111 comprised, for example, between 10 and 100, preferably between 10 and 50.

The first stopping layer 111 may have a selectivity with respect to the intermediate layer 112 comprised, for example, between 10 and 500, preferably between 30 and 150.

The intermediate layer 112 may have a selectivity with respect to the second stopping layer 113 comprised, for example, between 10 and 100, preferably between 10 and 50.

The second stopping layer 113 may have a selectivity with respect to the active area and in particular with respect to the active area 114 comprised, for example, between 10 and 500, preferably between 30 and 150.

These different etchings may consist of dry or wet etchings.

A silicon anisotropic etching solution will be selected, in particular a TMAH (tetramethylammonium hydroxide), TEAH (tetraethylammonium hydroxide), KOH, or $NH_4OH$ solution.

For illustration, the silicon is removed by wet etching with a diluted solution, for example, between 2% and 10% and preferably at 6% of TEAH at a temperature for example between 60° C. and 90° C. Alternatively, it is possible to use a TMAH solution at 5% for example at 60° C. It is also possible to select a dilute ammonia solution at 1 to 5%, for example 4%, at 60° C.

The silicon could also be removed through a dry etching, in particular a fluorinated-type plasma etching.

Advantageously, the first stopping layer 111 and/or the second stopping layer 113 are removed by wet etching.

For example, the SiGe etching solution is an acetic acid/HF/$H_2O_2$ mixture, a SC1 solution (a mixture of ammonium $NH_4OH$, hydrogen peroxide $H_2O_2$ and water) at room temperature or at hot temperature, a $H_2O_2$ solution at 5% at hot temperature (for example at 60° C.), a sulphuric acid solution at hot temperature (for example at 180° C.), a SPM ("Sulphuric peroxide mixture") solution, a CARO solution, a Piranha solution (a mixture of sulphuric acid for example heated up to 180° C. and oxygenated water).

What is claimed is:

1. A method for manufacturing a semiconductor-on-insulator substrate by Bonded and Etch back Silicon on Insulator (BESOI) comprising the following steps:
   a) provide a structure successively comprising:
      a first substrate made of silicon, comprising a first main face and a second main face,
      a first stopping layer made of SiGe having a first thickness and an atomic percentage of Ge lower than or equal to 30%, the first stopping layer being in contact with the second main face of the first substrate,
      an intermediate layer made of silicon or of SiGe, the atomic percentage of Ge of the intermediate layer being lower by at least 10% than the atomic percentage of Ge of the first stopping layer,
      a second stopping layer made of SiGe having a second thickness smaller than or equal to 20 nm, the second thickness being smaller than the first thickness of the first layer, the second stopping layer having an atomic percentage of Ge higher than or equal to 20%, the atomic percentage of Ge of the intermediate layer being lower by at least 10% than the atomic percentage of Ge of the second stopping layer,
      optionally, an active area formed by an active layer made of silicon or by a stack of active layers comprising at least one layer made of silicon and at least one layer made of SiGe,
      a dielectric layer,
      a second substrate,
   b) thin the first substrate made of silicon, from the first main face, so as to remove a first portion of the first substrate and leave a second portion of the first substrate,
   c) successively remove:
      the second portion of the first substrate, up to the second main face of the first substrate, so as to reach the first stopping layer,
      the first stopping layer,
      the intermediate layer,
      optionally, the second stopping layer, subject to which a semiconductor-on-insulator substrate is obtained comprising a substrate covered by the dielectric layer and the active area or a substrate covered by the dielectric layer and the second stopping layer made of SiGe.

2. The method according to claim 1, wherein the thinning step b) leads to a total thickness variation of the thinned first substrate larger than or equal to 2,000 nm.

3. The method according to claim 1, wherein the second thickness is at least twice as small as the first thickness.

4. The method according to claim 1, wherein the first stopping layer has an atomic percentage of Ge lower than or equal to 25%.

5. The method according to claim 1, wherein the first stopping layer has a thickness between 50 nm and 150 nm and an atomic concentration of Ge equal to 25%.

6. The method according to claim 1, wherein the second stopping layer has a thickness between 8 nm and 20 nm and an atomic concentration of Ge equal to 40%.

7. The method according to claim 1, wherein the intermediate layer or the active layer made of silicon has a thickness between 5 nm and 100 nm.

8. The method according to claim 1, wherein the structure provided at step a) is obtained according to the following steps:
   i) provide a first stack successively comprising:
      the first substrate made of silicon,
      the first stopping layer made of SiGe having the first thickness and the atomic percentage of Ge lower than or equal to 30%,
      the intermediate layer made of silicon or of SiGe, the atomic percentage of Ge of the intermediate layer being lower by at least 10% than the atomic percentage of Ge of the first stopping layer,
      the second stopping layer made of SiGe having the second thickness smaller than or equal to 20 nm, the second thickness being smaller than the first thickness of the first layer, the second stopping layer having the atomic percentage of Ge higher than or equal to 20%, the atomic percentage of Ge of the intermediate layer being lower by at least 10% than the atomic percentage of Ge of the second stopping layer,
      optionally, the active area formed by the active layer made of silicon or by the stack of active layers comprising the at least one layer made of silicon and the at least one layer made of SiGe preferably having an atomic percentage of Ge comprised between 20% and 35%,
   ii) provide a second stack comprising the second substrate made of silicon covered by the dielectric layer,
   iii) fasten the first stack over the second stack, so as to have the dielectric layer in contact with the second stopping layer or with the active area.

9. The method according to claim 1, wherein, the first stopping layer made of SiGe has an atomic percentage of Ge comprised between 10% and 30%.

10. The method according to claim 1, wherein the dielectric layer is made of silicon oxide and the second substrate is made of silicon.

11. The method according to claim 1, wherein the second portion of the first substrate, the first stopping layer and the intermediate layer are removed by chemical etching.

12. The method according to claim 1, wherein the second thickness is at least 10 times smaller than the first thickness.

13. The method according to claim 1, wherein the first stopping layer has an atomic percentage of Ge lower than or equal to 25% and higher than or equal to 20%.

14. The method according to claim 1, wherein the second stopping layer has an atomic percentage of Ge higher than or equal to 20%, and lower than or equal to 40%.

15. The method according to claim 1, wherein the second portion of the first substrate has a thickness smaller than or equal to 50 μm.

* * * * *